United States Patent
Tailliet et al.

(10) Patent No.: US 9,455,034 B1
(45) Date of Patent: Sep. 27, 2016

(54) METHOD AND SYSTEM FOR MANAGING A WRITING CYCLE OF A DATA IN A EEPROM MEMORY CELL

(71) Applicant: STMicroelectronics (Rousset) SAS, Rousset (FR)

(72) Inventors: François Tailliet, Fuveau (FR); Marc Battista, Marseilles (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 15/055,552

(22) Filed: Feb. 27, 2016

(30) Foreign Application Priority Data

Aug. 6, 2015 (FR) ...................... 15 57576

(51) Int. Cl.
*G11C 16/06* (2006.01)
*G11C 13/00* (2006.01)
*G11C 16/34* (2006.01)

(52) U.S. Cl.
CPC ....... *G11C 13/0097* (2013.01); *G11C 13/0069* (2013.01); *G11C 16/3436* (2013.01); *G11C 16/3445* (2013.01); *G11C 16/3459* (2013.01)

(58) Field of Classification Search
CPC ................................................ G11C 16/3436
USPC ...................................................... 365/185.22
See application file for complete search history.

(56) References Cited

U.S. PATENT DOCUMENTS

| | | | |
|---|---|---|---|
| 7,012,837 B2 * | 3/2006 | Naura | G11C 8/08 365/185.19 |
| 2006/0087888 A1 | 4/2006 | Jeong | |
| 2009/0066483 A1 | 3/2009 | Naura et al. | |
| 2013/0229868 A1 | 9/2013 | Koh et al. | |
| 2016/0118126 A1 * | 4/2016 | Moon | G11C 16/3459 711/103 |

FOREIGN PATENT DOCUMENTS

FR 2890484 A1 3/2007

* cited by examiner

*Primary Examiner* — Son Mai
(74) *Attorney, Agent, or Firm* — Slater Matsil, L.L.P.

(57) ABSTRACT

An operation for writing at least one datum in at least one memory cell of the electrically erasable and programmable read-only memory type comprises at least one step of erasing or of programming of the cell by a corresponding erasing or programming pulse. The correct or incorrect conducting of the writing operation is checked by an analysis of the form of the erasing or programming pulse during the corresponding erasing or programming step. The result of this analysis is representative of the writing operation being conducted correctly or incorrectly.

21 Claims, 3 Drawing Sheets

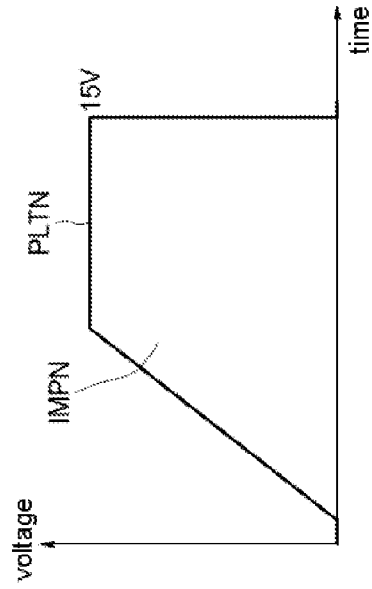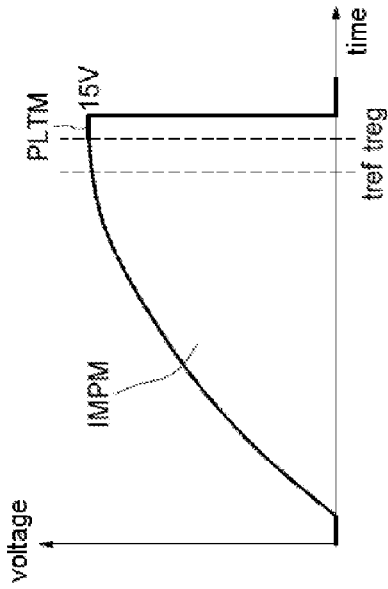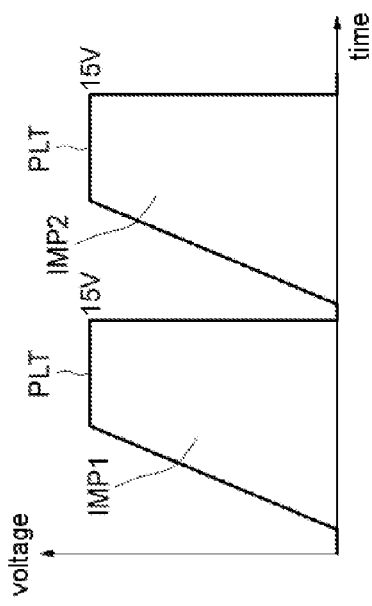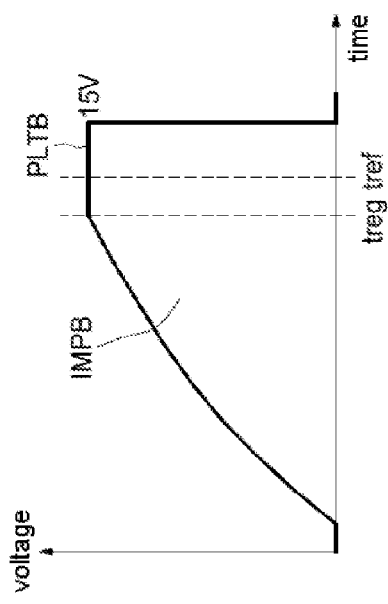

METHOD AND SYSTEM FOR MANAGING A WRITING CYCLE OF A DATA IN A EEPROM MEMORY CELL

This application claims priority to French Application No. 1557576, filed on Aug. 6, 2015, which application is hereby incorporated herein by reference.

TECHNICAL FIELD

Implementations and embodiments of the invention relate to the electrically erasable and programmable read-only memories, called EEPROM memories, and more particularly the checking of the correct or incorrect conducting of the writing operation.

SUMMARY

The invention applies advantageously but in a non-limiting manner to the checking of the level of charge of a power supply, for example a battery or battery cells, powering an apparatus incorporating one or more of these memories. Such is the case for example with auditory prostheses which prove particularly "greedy" in battery cells. Also, having an indicator of the level of charge of these battery cells would make it possible to change them only when necessary, particularly when the level of charge no longer makes it possible, for example, to conduct a writing operation in the EEPROM memory correctly.

According to one implementation and embodiment, a novel solution is proposed that is simple to implement, for detecting the correct or incorrect conducting of a writing operation in a memory cell of the EEPROM type and thus provide an indication of a level of charge, low or good, of the power supply powering the memory cell and its associated circuitry.

A memory cell of the EEPROM type generally comprises a transistor having a floating gate that makes it possible to store the datum, a control gate, a source region and a drain region. Such a memory cell uses the principle of the non-volatile storage of charges on the floating gate of the transistor. Conventionally, the operation or cycle of writing a datum comprises an erasing step followed by a programming step.

The programming is done by Fowler-Nordheim effect by using a voltage pulse comprising a ramp followed by a voltage plateau having a high value, typically of the order of 13 to 15 volts, and comprises the injection by electron tunnel effect from the floating gate to the drain while the erasing, which is also performed by Fowler-Nordheim effect, comprises an injection by electron tunnel effect from the drain to the floating gate and is also performed by using an erasing pulse of a form similar to that of the programming pulse.

According to one aspect, a method is proposed for checking an operation for writing at least one datum in at least one memory cell of the electrically erasable and programmable read-only memory type, comprising at least one step of erasing or programming of the cell by a corresponding erasing or programming pulse.

In effect, in certain cases, based on the logic value of the datum or of the word to be written, the writing operation may comprise only an erasing step or only a programming step.

Thus, if for example the word to be written contains only "0"s, then only an erasing step is necessary.

Similarly, when the word 0F (in hexadecimal notation) has to be replaced by the word 1F, the erasing step is pointless.

The method according to this aspect also comprises an analysis of the form of the erasing or programming pulse during the corresponding erasing or programming step, the result of this analysis being representative of the writing operation being conducted correctly or incorrectly.

Thus, whereas in the prior art an EEPROM cell is written "blind", that is to say that the writing operation is non-algorithmic and without any checking during the actual writing operation, the method according to this aspect provides for a check to be performed during the writing operation (erasing step or programming step) by analysing the form of the corresponding erasing or programming pulse.

Also, such an analysis is simpler to implement than a conventional check of a correct or incorrect write that provides, after the writing, a rereading of the written datum with modified reading parameters.

When the writing operation comprises the step of erasing followed by the step of programming of the cell, the method further comprises an analysis of the form of each of the pulses during the corresponding step, the result of this analysis being representative of the writing operation being conducted correctly or incorrectly.

A nominal erasing pulse and/or a nominal programming pulse comprises a ramp followed by a plateau having a nominal voltage, and the form analysis then advantageously comprises a determination of the duration of the plateau, a plateau having a duration less than a limit duration being representative of the writing operation being conducted incorrectly.

According to one implementation, the determination of the duration of the plateau comprises a determination of the instant of occurrence of the plateau and a comparison of this instant of occurrence with a reference instant corresponding to a percentage of the duration of the corresponding nominal pulse, an instant of occurrence less than or equal to the reference instant being representative of the writing operation being conducted correctly and an instant of occurrence greater than the reference instant being representative of the writing operation being conducted incorrectly.

The reference instant corresponds, for example, to 80% of the duration of the nominal pulse.

According to another aspect, an application of the method as defined hereinabove is proposed for the checking of the level of charge of a power supply powering a memory device containing at least one memory cell of the EEPROM type.

According to another aspect, a memory device is proposed that comprises a memory plane containing at least one memory cell of the electrically erasable and programmable read-only memory type and check circuitry configured to check the conducting of an operation for writing at least one datum in the at least one memory cell comprising at least one step of erasing or of programming of the cell by a corresponding erasing or programming pulse, the check circuitry comprising analysis circuitry configured to perform an analysis of the form of the erasing or programming pulse during the corresponding erasing or programming step and deliver an indication representative of the writing operation being conducted correctly or incorrectly as a function of the result of this analysis.

According to an embodiment in which the writing operation comprises the step of erasing followed by the step of programming of the cell, the analysis circuitry is configured to perform an analysis of the form of each of the pulses during the corresponding step, and deliver the indication representative of the writing operation being conducted correctly or incorrectly as a function of the result of this analysis.

According to an embodiment in which a nominal erasing pulse and/or a nominal programming pulse comprises a ramp followed by a plateau having a nominal voltage, the analysis circuitry comprises determination circuitry configured to determine the duration of the plateau, a plateau having a duration less than a limit duration being representative of the writing operation being conducted incorrectly.

According to an embodiment, the determination circuitry comprises a detection module configured to detect the instant of occurrence of the plateau and a comparator configured to compare this instant of occurrence with a reference instant corresponding to a percentage of the duration of the corresponding nominal pulse, an instant of occurrence less than or equal to the reference instant being representative of the writing operation being conducted correctly and an instant of occurrence greater than the reference instant being representative of the writing operation being conducted incorrectly.

According to another aspect, an apparatus is proposed that comprises a memory device as defined hereinabove, a power supply configured to power the memory device, and a level indicator for indicating the level of charge of the power supply, the level indicator incorporating the check circuitry.

BRIEF DESCRIPTION OF THE DRAWINGS

Other advantages and features of the invention will become apparent on studying the detailed description of non-limiting implementations and embodiments, and the attached drawings in which:

FIGS. 1 to 6 schematically illustrate different implementations and embodiments of the invention.

DETAILED DESCRIPTION OF ILLUSTRATIVE EMBODIMENTS

Figure 1:
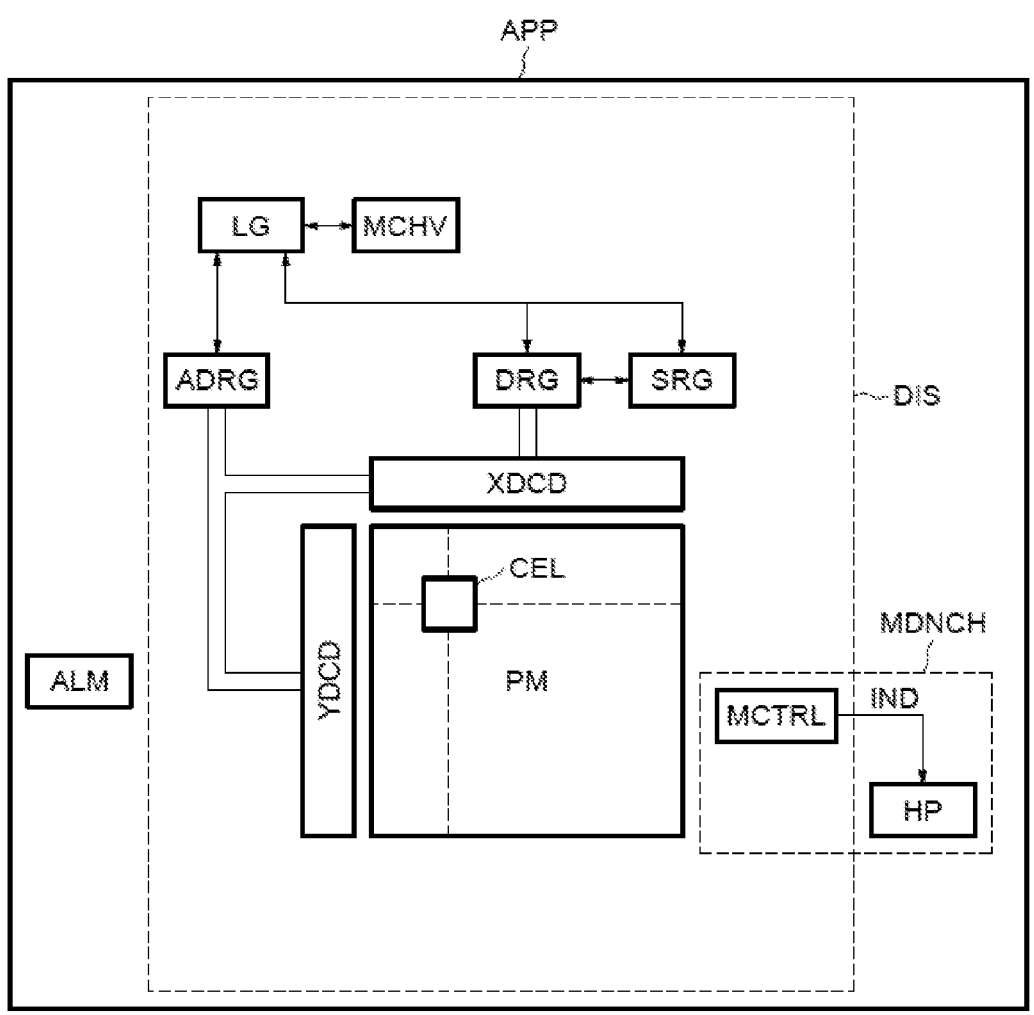

In FIG. 1, the reference APP denotes an apparatus, for example an auditory prosthesis, comprising a power supply ALM, for example a battery or cells, notably powering a non-volatile memory device DIS of the EEPROM type.

The memory device DIS also comprises check circuitry MCTRL configured, as will be seen in more detail hereinbelow, for checking the conducting of an operation for writing a datum in at least one memory cell of the memory plane PM of the memory device, and providing an indication IND representative of the level of charge of the power supply ALM.

The apparatus APP also incorporates indication circuitry MDNCH, incorporating the check circuitry MCTRL and, for example, a microcontroller, and intended to provide, in the presence of the indication IND, an audible alert for example, in particular one or several regular "beeps" using a mini loudspeaker HP.

In practice, and as a non-limiting example, as long as the mini loudspeaker is silent, the battery cells need not be changed. However, when the "beep" or "beeps" is/are emitted, the cells ALM are to be changed.

In practice, the microcontroller and the mini loudspeaker are already generally present in an auditory prosthesis and can also be associated with a signal processing processor. In this case, it is easy to embed a "system" sound in the auditory content delivered in the ear and the audible alert can be not only one or more "beeps" but also, for example, a specific phrase such as "please change the batteries".

The memory plane PM, of a structure that is conventional and known per se, comprises memory cells CEL of EEPROM type.

A column decoder XDCD and a row decoder YDCD make it possible to address the memory plane PM.

These decoders are themselves addressed by an address shift register ADRG.

The memory device DIS also comprises a data shift register DRG connected to the memory plane by the column decoder XDCD.

The addresses and data can be entered by the address ADRG and data DRG registers respectively and the data can be extracted via the data register DRG.

The memory device DIS also comprises a status register SRG linked to the data register DRG.

All of the circuitry is controlled by a control logic LG.

Finally, high voltage generator MGHV notably comprising a charge pump and its associated regulation, make it possible to generate the high voltage, typically of the order of 15 volts, to allow the operation for writing data in the memory, typically comprising an erasing step followed by a programming step.

It is recalled here that a memory cell of the EEPROM type comprises a transistor that conventionally has a control gate, a floating gate, a drain region and a source region.

Such a cell is erasable and programmable by Fowler-Nordheim effect.

As indicated hereinabove, the writing of a datum in such a cell of EEPROM type generally comprises an erasing step preceding a programming step.

In the erasing step, the drain and the source of the transistor are coupled to the ground and a control voltage having an erasing value, typically of the order of 15 volts, is applied to the control gate.

As for the programming of the cell, it is performed conventionally by linking the control gate to the ground and by applying a programming voltage to the drain, typically also of the order of 15 volts. With regard to the source, the source can either be left floating or precharged to a non-zero precharge voltage.

Although a memory cell of the EEPROM type has two main operating modes, namely a reading mode and a writing mode, the writing operation is the first to be defective when the power supply voltage Vdd decreases to a very low level. In effect, the erasing step or the programming step requires the internal generation of the high voltage, typically 15 volts, through a number of charge pump stages.

Thus, while the reading operation may be functionally correct up to 1.3 volts, the writing operation is generally considered as correct up to 1.6 volts and can then be degraded from 1.6 volts to 1.4 volts to be immediately considered defective below 1.4 volts.

Moreover, a cell written in a degraded operating mode may be read correctly at the instant t=0 and may then be defective just after.

FIG. 2 illustrates a writing operation implemented by the use of an erasing pulse IMP1 followed by a programming pulse IMP2. The maximum value of the duration of the writing operation, substantially equal to the sum of the durations of the pulses IMP1 and IMP2, is included in the specifications of the memory.

Each voltage/time pulse exhibits a ramp which controls the tunnel current of the cell, followed by a plateau PLT, typically at a nominal level of 15 volts.

FIG. 3 is a zoom of one of the pulses IMP1 or IMP2 and this pulse IMPN here represents a nominal pulse of trapezoidal form having a plateau of nominal characteristics PLTN. In the nominal case, the duration of the pulse IMPN is fixed, equal for example to 1.5 ms and the duration of the plateau PLTN is for example equal to 1 ms.

As indicated above, while the writing operation generally comprises an erasing step followed by a programming step, it is possible, in certain cases, for a single erasing or programming step to be necessary to write a word in the memory.

Thus, if the word to be written contains only "0"s, then only an erasing step is necessary.

Similarly, when the word 0F (in hexadecimal notation) has to be replaced by the word 1F, the erasing step is pointless.

As indicated above, the high voltage generation generator that allows for the generation of the pulses IMP1 and/or IMP2 comprise one or more charge pump stages associated with a charge pump regulation comprising, for example, an oscillator.

The regulation makes it possible to check the output voltage of the charge pump. The oscillator is stopped when the output of the charge pump exceeds a high reference. The output voltage of the charge pump then begins to decay because of the charge. As soon as the output voltage of the charge pump is less than a low reference, the oscillator restarts. The voltage difference between the low and high references (hysteresis) ensures the stability. This voltage difference is for example of the order of 100 millivolts.

The regulation level of the charge pump is for example the voltage level of the plateau PLT, for example 15 volts. The charge ramp is for example generated by an analogue integrator which receives the plateau voltage as input.

The duration of the pulse (ramp+plateau) is controlled by an analogue or digital timer.

By way of indication, a digital timer can comprise an oscillator of fixed frequency connected to a counter. The counter starts when the charge pump starts and the end of the counting marks the end of the pulse.

As is the conventional practice, the programming or erasing pulse, generated by the charge pump stage or stages and the associated regulation, is applied to a circuit exhibiting a capacitive charge and leakage currents.

When the power supply voltage drops, the fan-out from the charge pump drops greatly.

Also, when the fan-out from the charge pump is low, its current can for example be less than the current needed for the capacitive charge, in which case the ramp takes on an appearance of the type of that illustrated in FIG. 4, slowing down and taking a curved form, the plateau being naturally shortened.

When the fan-out from the charge pump is low, its current may also be less than the leakage currents and the nominal voltage of the plateau is not then reached.

These two alternatives can also be aggregated.

According to one aspect of the invention, the correct or incorrect conducting of the operation for writing a datum in a memory cell, or more generally the correct or incorrect conducting of the writing of at least one word in the memory plane PM will be checked by analysing, during the writing operation, the form of the erasing pulse and/or of the programming pulse during the corresponding erasing and/or programming step.

In this respect, this form analysis can advantageously be implemented by a determination of the duration of the plateau of the corresponding pulse.

Thus, a plateau having a duration less than a limit duration is representative of the writing operation being conducted incorrectly.

To determine this plateau duration, it is possible for example to determine the instant of occurrence of the plateau, that is to say the instant at which the ramp ends, that is to say the instant at which the voltage level of the pulse reaches the level of the plateau.

Furthermore, this is possible notably because the erasing or programming pulse generation circuitry makes it possible to detect the instant at which the plateau is reached, that is to say the moment when the instantaneous amplitude of the pulse during the ramp reaches the fixed set point of maximum amplitude of the pulse (which is that of the plateau).

It is then possible to compare this instant of occurrence with a reference instant which corresponds to a percentage of the duration of the corresponding pulse, for example 80% of the duration of a nominal pulse.

Also, if this instant of occurrence is less than or equal to the reference instant, then the conducting of the writing operation is considered to be correct whereas, if this instant of occurrence is greater than the reference instant, then the conducting of the writing operation is considered to be incorrect.

This will be illustrated in more detail with reference more particularly to FIGS. 4 and 5.

In these figures, it is considered that there is a low power supply voltage situation leading to a limitation of the charge pump.

As explained hereinabove, the ramp is then slower than the rectilinear ramp of the nominal case and has the form of a charge curve of a resistive-capacitive circuit RC.

In these two figures, treg denotes the instant of occurrence of the plateau and tref denotes the reference instant equal to a percentage of the nominal duration of a pulse, for example 80% of 1.5 ms.

In FIG. 4, it can be seen that the instant of occurrence treg of the plateau PLTB of the pulse IMPB is situated before the instant tref. In this case, the duration of the plateau PLTB is considered to be sufficient to ensure a correct writing of the word in the memory.

In this situation, the writing operation is therefore considered to be conducted correctly.

By contrast, in FIG. 5, the instant of occurrence treg of the plateau PTM of the pulse IMPM is situated after the reference instant tref.

Consequently, the duration of the plateau PLTM is insufficient to ensure a correct writing of the word in the memory and therefore the writing operation is considered to be conducted incorrectly.

The reference instant tref is for example determined in the factory during the memory characterization phase.

Figure 6:
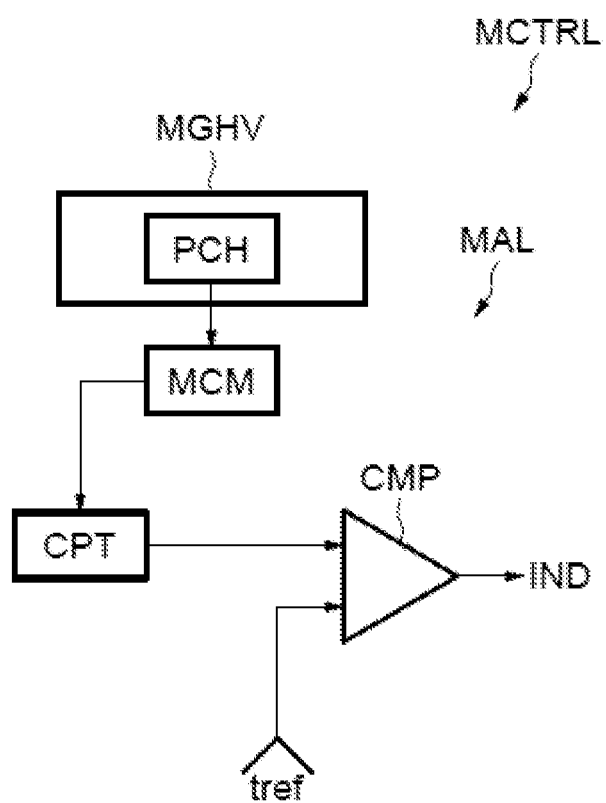

In practice, as illustrated in FIG. 6, the analysis circuitry MAL configured to analyse the form of the erasing and/or programming pulse comprises a detection module MCM configured to detect the instant treg from the output voltage of the assembly PCH (charge pump+regulation).

At this instant, the value of the counter CPT is read and stored for example in a flip-flop.

A comparator CMP then compares this value of the counter to the reference instant tref and then delivers the indication IND representative of the writing operation being conducted correctly or incorrectly.

This indication IND can for example be a bit taking the value "1" for the writing operation being conducted incorrectly and the value "0" for the writing operation being conducted correctly.

Thus, if for example the nominal duration of an erasing and/or writing pulse is reflected by a counter having a value equal to 1024, the instant tref can be considered to be equivalent to a counter value equal to 800.

The value of the bit IND can be accessible via a bus of the STI type by using, for example, one of the unused bits of a status word present in the status register SRG.

This bit IND can be a volatile bit reset to "0" each time the operation of the apparatus APP is stopped.

As indicated above, when the microcontroller associated with the EEPROM memory detects the presence of a bit IND equal to "1" it can then make the decision to send one or more "beeps" and/or a specific phrase via the loudspeaker HP indicating to the user that a battery change is urgently needed. The microcontroller can also take the decision to prevent any new writing command in the EEPROM memory in order to avoid any malfunctioning.

What is claimed is:

1. A method for operating an electrically erasable and programmable read-only type memory device, the method comprising:
    performing a write operation by erasing or programming to a memory cell using a corresponding an erasing pulse or a programming pulse; and
    analyzing a form of the erasing pulse or programming pulse during the corresponding erasing or programming step, a result of the analyzing being representative of whether the write operation was performed correctly or incorrectly.

2. The method according to claim 1, wherein performing the write operation comprises erasing the memory cell and then programming the memory cell; and
    wherein the analyzing comprises analyzing the form of the erasing pulse during the erasing step and analyzing the form of the programming pulse during the programming step.

3. The method according to claim 1, wherein performing the write operation comprises erasing the memory cell using the erasing pulse and the analyzing comprises analyzing the form of the erasing pulse during the erasing step;
    wherein a nominal erasing pulse comprises a ramp followed by a plateau having a nominal voltage; and
    wherein the analyzing comprises determining a duration of the plateau of the erasing pulse, wherein the result indicates that the write operation was performed incorrectly when a plateau has a duration less than a limit duration.

4. The method according to claim 3, wherein determining the duration of the plateau comprises determining an instant of occurrence of the plateau and comparing the instant of occurrence with a reference instant that corresponds to a percentage of the duration of the plateau of the nominal erasing pulse, wherein the result indicates that the write operation was performed correctly when the instant of occurrence is less than or equal to the reference instant and the result indicates that the write operation was performed incorrectly when the instant of occurrence is greater than the reference instant.

5. The method according to claim 4, wherein the reference instant corresponds to 80% of a duration of the plateau of the nominal erasing pulse.

6. The method according to claim 1, wherein performing the write operation comprises programming the memory call using an programming pulse and the analyzing comprises analyzing the form of the programming pulse during the programming step;
    wherein a nominal programming pulse comprises a ramp followed by a plateau having a nominal voltage; and
    wherein the analyzing comprises determining a duration of the plateau of the programming pulse, wherein the result indicates that the write operation was performed incorrectly when a plateau has a duration less than a limit duration.

7. The method according to claim 6, wherein determining the duration of the plateau comprises determining an instant of occurrence of the plateau and comparing the instant of occurrence with a reference instant that corresponds to a percentage of the duration of the plateau of the nominal programming pulse, wherein the result indicates that the write operation was performed correctly when the instant of occurrence is less than or equal to the reference instant and the result indicates that the write operation was performed incorrectly when the instant of occurrence is greater than the reference instant.

8. The method according to claim 7, wherein the reference instant corresponds to 80% of a duration of the plateau of the nominal programming pulse.

9. The method according to claim 1, wherein the analyzing comprising checking a level of charge of a power supply powering the memory device.

10. A memory device, comprising:
    a memory plane that includes a plurality of electrically erasable and programmable read-only memory type memory cells; and
    check circuitry configured to verify that a write operation for writing a datum to memory cell the memory plane, the write operation comprising an erasing step or a programming step that includes a corresponding erasing or programming pulse, the check circuitry configured to analyze a form of the erasing or programming pulse during the corresponding erasing or programming step and to deliver an indication that represents whether the write operation was conducted correctly or incorrectly based on a result of the analyzing.

11. The device according to claim 10, wherein the write operation comprises the erasing step followed by the programming step, and wherein the check circuitry is configured to analyze the form of both the erasing step and the programming step and to deliver the indication based the result of analyzing both the erasing step and the programming step.

12. The device according to claim 10, wherein a nominal erasing pulse or a nominal programming pulse comprises a ramp followed by a plateau having a nominal voltage, and wherein the check circuitry is configured to determine a duration of a plateau of the erasing or programming pulse, a plateau having a duration less than a limit duration being representative of the write operation being conducted incorrectly.

13. The device according to claim 12, wherein the check circuitry is configured to detect an instant of occurrence of the plateau and to compare the instant of occurrence with a reference instant that corresponded to a percentage of the duration of a corresponding nominal pulse, an instant of occurrence less than or equal to the reference instant being representative of the write operation being conducted correctly and an instant of occurrence greater than the reference instant being representative of the write operation being conducted incorrectly.

14. The device according to claim 13, wherein the reference instant corresponds to 80% of the duration of the nominal pulse.

15. The device according to claim 10, further comprising a power supply coupled to the memory plane, the check circuitry being configured to indicate a level of charge of the power supply.

16. The device according to claim 10, wherein the memory device is configured to be coupled to a power supply external to the memory device, the check circuitry being configured to indicate a level of charge of the power supply.

17. An apparatus comprising:
a power supply; and
an EEPROM device coupled to the power supply, the EEPROM device comprising a memory plane that includes a plurality of memory cells and check circuitry configured to verify a write operation that includes an erasing step or a programming step that uses a corresponding erasing or programming pulse, the check circuitry configured to analyze a form of the erasing or programming pulse during the corresponding erasing or programming step and to deliver an indication that represents whether the write operation was conducted correctly or incorrectly based on a result of the analyzing, the indication providing information regarding a level of charge of the power supply.

18. The apparatus according to claim 17, wherein the apparatus comprises an auditory prosthesis.

19. The apparatus according to claim 17, further comprising a speaker coupled to the memory device and configured to provide an audible alert related to the indication.

20. The apparatus according to claim 17, wherein the write operation comprises the erasing step followed by the programming step, and wherein the check circuitry is configured to analyze the form of both the erasing step and the programming step and to deliver the indication based the result of analyzing both the erasing step and the programming step.

21. The apparatus according to claim 17, wherein a nominal erasing pulse or a nominal programming pulse comprises a ramp followed by a plateau having a nominal voltage, and wherein the check circuitry is configured to determine a duration of a plateau of the erasing or programming pulse, a plateau having a duration less than a limit duration being representative of the write operation being conducted incorrectly.

\* \* \* \* \*